United States Patent [19]

Guajardo

[11] Patent Number: 4,924,344
[45] Date of Patent: May 8, 1990

[54] CIRCUITRY FOR PROTECTION AGAINST ELECTROMOTIVELY-INDUCED VOLTAGE TRANSIENTS IN SOLID STATE RELAY CIRCUITS

[75] Inventor: Ciro Guajardo, Harbor City, Calif.

[73] Assignee: Teledyne Industries, Inc., Los Angeles, Calif.

[21] Appl. No.: 316,241

[22] Filed: Feb. 27, 1989

[51] Int. Cl.$^5$ .............................................. H02H 3/08
[52] U.S. Cl. ...................................... 361/101; 261/86; 261/91; 261/98
[58] Field of Search ........................ 361/56, 57, 87, 86, 361/91, 93, 98, 100, 101; 330/207 P, 298

[56] References Cited

U.S. PATENT DOCUMENTS

| | | | |
|---|---|---|---|
| 4,423,431 | 12/1983 | Sasaki | 357/41 |
| 4,424,544 | 1/1984 | Chang | 361/56 |
| 4,528,608 | 7/1985 | Andersson | 361/18 |
| 4,541,002 | 9/1985 | Shimada | 357/51 |
| 4,546,401 | 10/1985 | Svedberg | 361/91 |
| 4,551,779 | 11/1985 | Murakami | 361/86 |
| 4,566,052 | 1/1986 | Kammiller | 361/18 |
| 4,573,099 | 2/1986 | Ganesan | 361/56 |
| 4,581,540 | 4/1986 | Guajardo | 361/98 X |
| 4,617,482 | 10/1986 | Matsuda | 307/579 |
| 4,644,250 | 2/1987 | Hartgring | 323/225 |
| 4,661,879 | 4/1987 | Sato et al. | 361/58 |
| 4,686,383 | 8/1987 | Croft | 307/200 |
| 4,691,129 | 9/1987 | Einzinger | 307/581 |
| 4,716,511 | 12/1987 | Masaki | 363/49 |

*Primary Examiner*—Derek S. Jennings
*Attorney, Agent, or Firm*—Stephen L. King

[57] ABSTRACT

In a solid state relay circuit including a power semiconductor for switching power to a load circuit and having circuitry for disabling the power semiconductor to protect against current overload or short circuits, such disabling means including a silicon controlled rectifier for short circuiting the input to the power semiconductor, apparatus for sensing the presence of transient voltages in the load circuit, and apparatus for disabling any short circuit caused by the silicon controlled rectifier due to such voltage transients.

6 Claims, 1 Drawing Sheet

4,924,344

CIRCUITRY FOR PROTECTION AGAINST ELECTROMOTIVELY-INDUCED VOLTAGE TRANSIENTS IN SOLID STATE RELAY CIRCUITS

BACKGROUND OF THE INVENTION

1. Field of the Invention

This invention relates to solid state relay circuits and, more particularly, to solid state relay circuits with overload and short circuit protection circuitry and additional circuitry to protect the circuit from rapidly occurring voltage changes caused by electromotive induction in the output circuitry.

2. History of the Prior Art

A great variety of solid state relay circuits have been developed which use a power semiconductor as the output circuit switching device. A major disadvantage of such circuits has been their sensitivity to current overload or short circuit which may destroy the switching device. For this reason, various circuitry has been devised to turn off the switching devices when overload currents or short circuit conditions occur. Examples of such circuits are disclosed in U.S. Pat. Ser. No. 4,581,540, entitled Circuitry Overload Protected Solid State Relay, Ciro Guajardo, issued April 8, 1986.

Although such circuits provide appropriate protection against current overloads and short circuits in the load circuitry, a major disadvantage of such circuits has been their sensitivity to voltage transients in the load circuitry. Such voltage transients may be transferred by the interterminal capacitance to the gate of the switching device and cause the momentary turn on of the switching device at an inopportune time. Often these voltages transients are due to electromotive induction in the output circuit so that they are continually recurring. It is therefore necessary to, essentially, immunize the output switching device against such voltage transients. This is especially difficult where the switching circuit includes silicon controlled rectifiers (SCRs) as a part of the current overload protection.

It is therefore an object of this invention to provide improved solid state relay circuits.

It is another object of this invention to provide solid state relay circuits which include current overload protection with circuitry for eliminating the response of the output switching device to voltage transients in the load circuit.

It is another object of this invention to provide solid state relay circuits incorporating circuitry for reducing the response of the output switching device to the conductive susceptibility of silicon controlled rectifiers (SCRs) when voltage transients occur in the load circuit.

SUMMARY OF THE INVENTION

The foregoing and other objects of the invention are accomplished by a solid state relay circuit which utilizes a metal oxide power semiconductor field effect transistor (MOSFET) having drain and source terminals which are connected to circuit output terminals. The output terminals are connected in series across a load and a power source. A switching circuit is provided which senses current overload and short circuit conditions in the load and, if sufficiently great, shorts the gate terminal of the MOSFET to eliminate the voltage biasing the MOSFET into conduction. A second switching circuit is provided in accordance with this invention which senses the voltage transient in the load and, if sufficiently great, shorts the gate terminal of the MOSFET before it has time to respond to the voltages changes and turn on.

Other objects, features, and advantages of the invention will become apparent to those skilled in the art upon reading the following detailed description together with the single figure of the drawings.

DETAILED DESCRIPTION OF THE INVENTION

Figure 1:
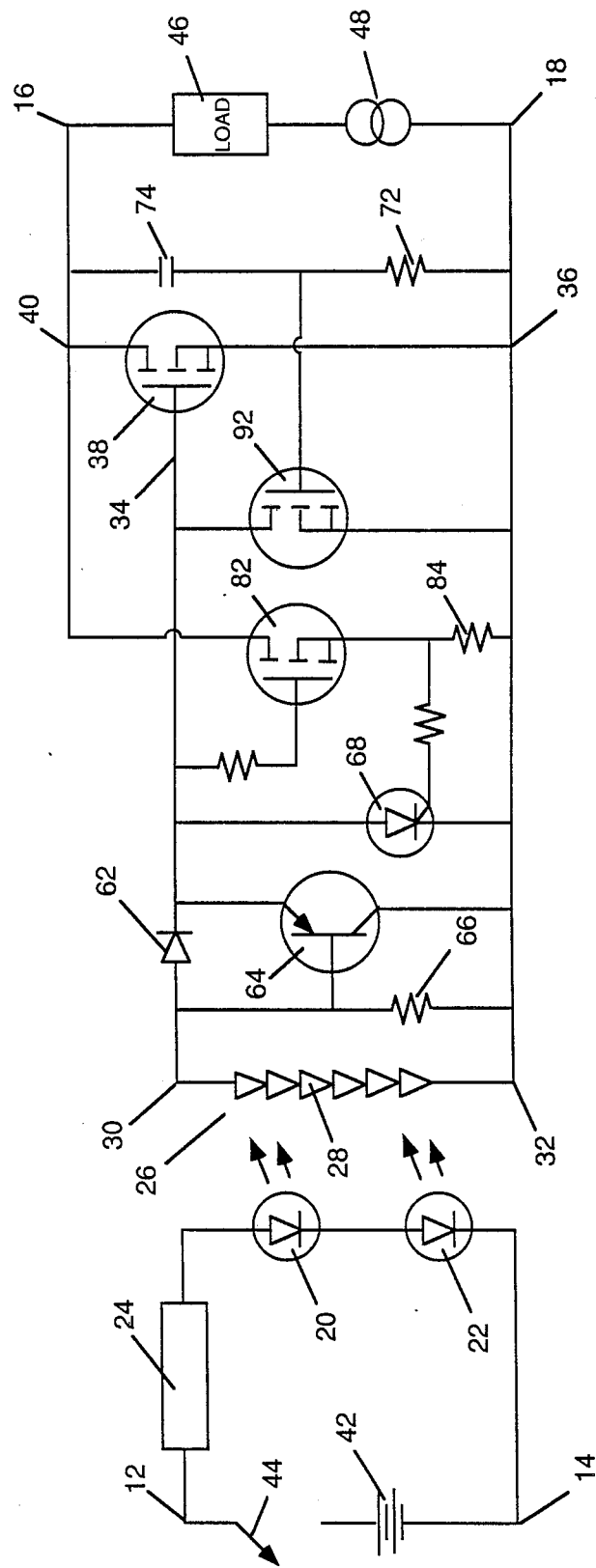
FIG. 1 is a schematic diagram of a circuit including the invention in which a MOSFET biased by a timing circuit is used to short circuit the gate to source terminals of an output switching MOSFET when voltage transients appear in the load.

Referring to FIG. 1 there is shown a control circuit 10 constructed in accordance with the invention. The circuit 10 includes a pair of input terminals 12 and 14 and a pair of output terminals 16 and 18. Connected between the terminals 12 and 14 is a series circuit comprising first and second light emitting diodes (LEDs) 20 and 22 and a current limiting element such as a resistor 24.

In the preferred embodiment of the invention the LEDs 20 and 22 provide infrared light output signals when activated. The LEDs 20 and 22 are positioned adjacent to and optically coupled to a photodiode array 26 having positive and negative output terminals 30 and 32, respectively. The array 26 includes a plurality of photodiodes 28 connected in series to form a photovoltaic voltage source. It is well known to those skilled in the art that a photodiode will produce a voltage and a current (approximately one half a volt at about ten microamperes for a small area silicon diode) in response to light impinging on the surface thereof. The amount of current available from a particular photodiode is proportional to the amount of light impinging on its surface.

By connecting in series a plurality of photodiodes 28, the voltages generated by each are added to produce a desired voltage level at the output terminals 30 and 32 of the array 26. In the preferred embodiment, sixteen photodiodes 28 are connected in series to produce an output voltage of about eight volts at a current level of about ten microamperes in response to light from the LEDs 20 and 22; this voltage is sufficient to operate the output switching device of the circuit. The number of LEDs used to illuminate the array 26 is a matter of design choice The array 26 is typically fabricated as an integrated circuit device using manufacturing techniques such as dielectric isolation which are well known to those skilled in the art.

The positive terminal 30 of the array 26 is connected by a diode 62 to the gate terminal 34 of an N-channel, enhancement mode MOSFET 38. The negative terminal 32 of the array 26 is connected to the source terminal 36 of the MOSFET 38, and the drain and source terminals of the MOSFET 38 are, in turn, connected respectively to the circuit output terminals 16 and 18.

Power MOSFETs are characterized by their ability to switch several amperes of current between their output (drain and source terminals) from a power source of up to several hundred volts. These devices exhibit low output resistance in the on, or conducting, state (typically one-one hundredth of an ohm to ten ohms) and exhibit high output resistance in the off, or nonconducting state (typically one to one hundred megohms). A typical MOSFET device for use in the invention is type number IRF520, supplied by International Rectifier, E1 Segundo, Calif., or RSP 12N10 manufactured by RCA.

The MOSFET 38 is biased into full conduction by the application of a first level of voltage (typically six to eight volts) between the gate and source terminals 34 and 36. The first level of voltage is referred to as the turn-on voltage of the MOSFET 38. When the gate to source voltage is below a second level of voltage (typically 3 to 5 volts) the MOSFET 38 is biased into a non-conducting state. This second level of voltage is referred to as the turn-off voltage of the MOSFET 38.

The operation of the circuit 10 as discussed thus far is as follows. An input signal is applied to the input terminals 12 and 14 by, for example, connecting a voltage source 42 across the terminals 12 and 14 using a switch 44 as shown in FIG. 1. In response to the input signal, the LEDs 20 and 22 generate light. This light is optically coupled to the diode array 26 which causes it to produce a voltage across the gate and source terminals 34 and 36 of the MOSFET 38. The MOSFET 38 is biased into full conduction providing a low impedance current path across the output terminals 16 and 18. When the MOSFET 38 is conducting, power is applied to a load 46 from a power source 48. The load 46 and the source 48 are connected in series across the terminals 16 and 18 as shown in FIG. 1. When the switch 44 is opened, the LEDs 20 and 22 no longer generate light. Consequently, the voltage provided by the array 26 drops to zero, and the MOSFET 38 turns off.

Connected between the terminal 30 of the array 26 and the gate terminal 34 of the MOSFET 38 is the diode 62 oriented to permit current flow toward the gate terminal 34. A PNP bipolar transistor 64 is provided having its emitter terminal connected to the gate terminal 34, its collector terminal connected to the source terminal 36 of the MOSFET 38, and its base terminal connected to the terminal 30 of the array 26. A resistor 66 is connected across the terminals 30 and 32 of the array 26. The PNP transistor 64 is normally non-conducting during the operation of the MOSFET 38. However, it is biased into conduction between its emitter and collector terminals when the array 26 ceases generating voltage thereby acting to speed up the turn-off time of the MOSFET 38 by providing a discharge path for the inherent capacitance associated with the gate-source elements of the MOSFET 38. The diode 62 couples the bias voltage from the array 26 to the gate 34 of the MOSFET 38. Accordingly, the MOSFET 38 responds to closures of the switch 44 by switching into a conducting state. When the switch 44 is opened, the MOSFET 38 switches to a nonconducting state in an extremely short interval of time due in part to the conduction of the transistor 64.

The circuit 10 of FIG. 1 includes a second MOSFET 82 connected in parallel with the MOSFET 38. The MOSFET 82 has its gate terminal connected to the gate terminal of the MOSFET 38 by a resistor 76, its source terminal connected by a resistor 84 to the source terminal of the MOSFET 38, and its drain terminal connected by a resistor 84 to the drain terminal of the MOSFET 38. In the preferred embodiment, the MOSFET 82 has a resistance across its source to drain terminal in the conducting condition of about ten ohms. The resistor 84 is selected in a preferred embodiment to have a value of about forty ohms.

In the normal operating condition of the MOSFET 38, the voltage drop across the internal resistance of the MOSFET 38 is insufficient to cause the MOSFET 82 to conduct. However, in a current overload or short circuit condition, the voltage across the MOSFET 38 increases sufficiently that, applied across the MOSFET 82 and the resistor 84, it turns on the MOSFET 82. The time required for the MOSFET 82 to turn on is controlled by the time constant produced by the resistor 72 and the inter-electrode capacitance of the MOSFET 82.

A silicon controlled rectifier (SCR) 68 has its anode connected to the gate terminal of the MOSFET 38, its gate terminal connected between the source terminal of the MOSFET 82 and the resistor 84 by a resistor 100, and its cathode connected to the source terminal of the MOSFET 38. When the MOSFET 82 responds to an overload current condition through the MOSFET 38 and begins conducting, almost the entire voltage across that MOSFET 38 is also across the resistor 84. This is a sufficient voltage (e.g., one-half volt) to cause the SCR 68 to turn on. Turning on the SCR 68 shorts the gate to source terminals of the MOSFET 38 causing it to turn off before it can be damaged by the overload current.

When the MOSFET 38 turns off and current ceases to flow through it, no more voltage is generated across the MOSFET 38 by current therethrough. Consequently, the voltage across the resistor 84 becomes insufficient to maintain the SCR 68 in operation and its ceases conducting.

Arrangements providing such short circuit and overload protection against overload current in an output switching MOSFET are disclosed in U.S. Pat. No. 4,581,540, above mentioned.

Although the circuits shown in U.S. Pat. No. 4,581,540 and above-described with respect to FIG. 1 of this specification are effective control circuits for protecting a metal oxide semiconductor field-effect power transistor from current overloads, such circuits still remain susceptible to transient voltages in the output circuitry. Such voltages are coupled back to the circuitry through the inter-electrode capacitance of the MOSFET 38 and may tend to affect the operation of various portions of the circuitry.

The circuit of this invention has been devised to reduce the possibility of transient voltages in the output circuitry, especially those caused by electromotive induction, causing the turn-on of the SCR 68. Such a problem is especially great because a SCR is easily operated by large voltage transient which are likely to be found in the output circuitry of the circuit of FIG. 1. If such occurs, then the gate-to-source terminals of the MOSFET 38 are shorted so that the MOSFET 38 cannot be operated In the arrangement shown in FIG. 1, the circuit 10 also includes a third MOSFET 92 connected between the gate and source terminals 34 and 36 of the MOSFET 38 and having its gate terminal connected between a capacitor 74 and a resistor 72. Under normal load conditions, the MOSFET 92 does not conduct and, therefore, does not affect the circuit. However, if a large voltage transient appears in the output circuit including the load 46 which is coupled by the inter-electrode capacitance of the MOSFET 38 and causes the SCR 68 to latch, this transient is also coupled by the capacitor 74 to the gate terminal of the MOSFET 92. The MOSFET 92 is turned on and operates to short circuit the path from the gate-to-source terminals of the MOSFET 38. Shorting this path also shorts the path of the SCR 68 for a sufficient period to reset the SCR 68 so that it remains ready to provide overload current protection.

It should be noted that the circuit of FIG. 1 can be changed so that the resistance/capacitance circuit including the resistor 72 and the capacitor 74 is placed between the gate and source terminals of the MOSFET 38 instead of between the source and drain terminals. In this case, the MOSFET 92 responds to the voltage transient coupled through the interelectrode capacitance of the MOSFET 38 rather to the direct coupling shown in the circuit of FIG. 1.

By means of the invention herein disclosed, the sensitivity to voltage transients in the load circuitry of solid state relay circuits which use a power semiconductor for switching device and also include current overload protection has been eliminated. The circuits disclosed herein may be used in the presence of large voltage transients without the voltage transients causing the elimination of current overload protection with possibly catastrophic results to the associated circuitry.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. In a solid state relay circuit including a power semiconductor for switching power to a load circuit and having means for disabling the power semiconductor to protect against current overload or short circuits, such disabling means including a silicon controlled rectifier for short circuiting the input to the power semiconductor, means for sensing the presence of transient voltages in the load circuit, and means for disabling any short circuit caused by the silicon controlled rectifier due to such voltage transients.

2. In a solid state relay circuit as claimed in claim 1, the means for disabling any short circuit caused by the silicon controlled rectifier due to such voltage transients comprising a MOSFET having gate, source, and drain terminals, the gate terminal being connected to the means for sensing the presence of transient voltages in the load circuit, and the source and drain terminals being connected to disable the silicon controlled rectifier.

3. In a solid state relay circuit as claimed in claim 1, the means for sensing the presence of transient voltages in the load circuit comprising a capacitor and a resistor connected in series across the output terminals of the power semiconductor.

4. In a solid state relay circuit as claimed in claim 3, the means for disabling any short circuit caused by the silicon controlled rectifier due to such voltage transients comprising a MOSFET having gate, source, and drain terminals, the gate terminal being connected between the capacitor and the resistor connected in series of the means for sensing the presence of transient voltages in the load circuit, and the source and drain terminals being connected to disable the silicon controlled rectifier.

5. In a solid state relay circuit as claimed in claim 1, the means for sensing the presence of transient voltages in the load circuit comprising a capacitor and a resistor connected in series across the input terminals of the power semiconductor.

6. In a solid state relay circuit as claimed in claim 5, the means for disabling any short circuit caused by the silicon controlled rectifier due to such voltage transients comprising a MOSFET having gate, source, and drain terminals, the gate terminal being connected between the capacitor and the resistor connected in series of the means for sensing the presence of transient voltages in the load circuit, and the source and drain terminals being connected to disable the silicon controlled rectifier.

* * * * *